(12) United States Patent
Tsutsui

(10) Patent No.: US 7,378,718 B2
(45) Date of Patent: May 27, 2008

(54) FUSE ELEMENT WITH ADJUSTABLE RESISTANCE

(75) Inventor: Masafumi Tsutsui, Shiga (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 93 days.

(21) Appl. No.: 11/091,469

(22) Filed: Mar. 29, 2005

(65) Prior Publication Data

US 2005/0285224 A1    Dec. 29, 2005

(30) Foreign Application Priority Data

Jun. 29, 2004   (JP) .............................. 2004-191532

(51) Int. Cl.
*H01L 23/62* (2006.01)

(52) U.S. Cl. ................. 257/529; 257/531; 257/E23.15; 438/132

(58) Field of Classification Search ................. 257/529, 257/531, E23.15; 438/132
See application file for complete search history.

(56) References Cited

U.S. PATENT DOCUMENTS 6,420,217 B1 * 7/2002 Kalnitsky et al. ............ 438/132
6,573,585 B2 * 6/2003 Arndt et al. ................. 257/529
6,624,499 B2 * 9/2003 Kothandaraman et al. .. 257/529
6,661,330 B1 * 12/2003 Young ......................... 337/297
6,933,591 B1 * 8/2005 Sidhu et al. ................. 257/665
7,109,564 B2 * 9/2006 Wu et al. .................... 257/529

FOREIGN PATENT DOCUMENTS

JP           2000-40790           2/2000

* cited by examiner

*Primary Examiner*—Howard Weiss
*Assistant Examiner*—John C Ingham
(74) *Attorney, Agent, or Firm*—McDermott Will & Emery LLP (57) ABSTRACT

A fuse element has a first region, a second region and a third region. The first region is a portion for isolating circuitry. The second region and the third region are respectively connected to both ends of the first region and have a wider pattern width than that of the first region. The second region, the first region and a part of the third region of the fuse element are formed on a thick insulating film, while the remaining part of the third region is formed on a thin insulating film. Heat generated in the fuse element is less likely to be released to a semiconductor substrate through the thick insulating film, but is more likely to be released to the semiconductor substrate through the thin insulating film. The fuse element therefore has a large temperature change and a large temperature gradient. This facilitates electrical blowing of the first region.

9 Claims, 8 Drawing Sheets

FUSE ELEMENT WITH ADJUSTABLE RESISTANCE

CROSS REFERENCE TO RELATED APPLICATIONS

This application claims priority under 35 U.S.C. §119 on Patent Application No. 2004-191532 filed in Japan on Jun. 29, 2004, the entire contents of which are hereby incorporated by reference.

BACKGROUND OF THE INVENTION

The present invention generally relates to a semiconductor device having a fuse element, and a manufacturing method thereof. More particularly, the present invention relates to a semiconductor device having a fuse element which is formed from a semiconductor layer such as polysilicon, a metal layer such as silicide, or a laminated structure of a semiconductor layer and a metal layer, and a manufacturing method thereof.

Fuse elements have been used in semiconductor devices in order to designate a bit for using a redundant circuit of memory circuitry, to adjust a resistance of analog circuitry, to activate functions of logic circuitry, and the like. By forming a fuse element simultaneously with elements such as a transistor in the same semiconductor device, an electric resistance of the fuse element can be adjusted from the outside after the semiconductor device is manufactured and tested, so that operation of a desired function can be controlled.

A polysilicon fuse element which is electrically blown by laser treatment, an anti-fuse element which is formed between lower and upper electrodes and blown by dielectric breakdown of a thin film insulator, and the like have been used in semiconductor devices. With recent improvement in integration and miniaturization of semiconductor devices, however, such kinds of fuse element are going to be replaced with a fuse element having a polysilicon resistor of an elongated shape. This kind of fuse element is blown by heating the polysilicon resistor to its melting point or higher by Joule heat generated by applying a current to the polysilicon resistor (for example, refer to Japanese Patent Laid-Open Publication No. 2000-40790). Hereinafter, this kind of fuse element is referred to as an electric fuse element in order to distinguish this kind of fuse element from a fuse element which is blown by laser treatment and an anti-fuse element.

In such an electric fuse element, a fuse portion (a portion of a fuse element for isolating circuitry) formed from a polysilicon resistor need not be completely blown. The fuse portion is melted and thinned by heat generated by applying a current, thereby increasing a resistance value.

Figure 7A:
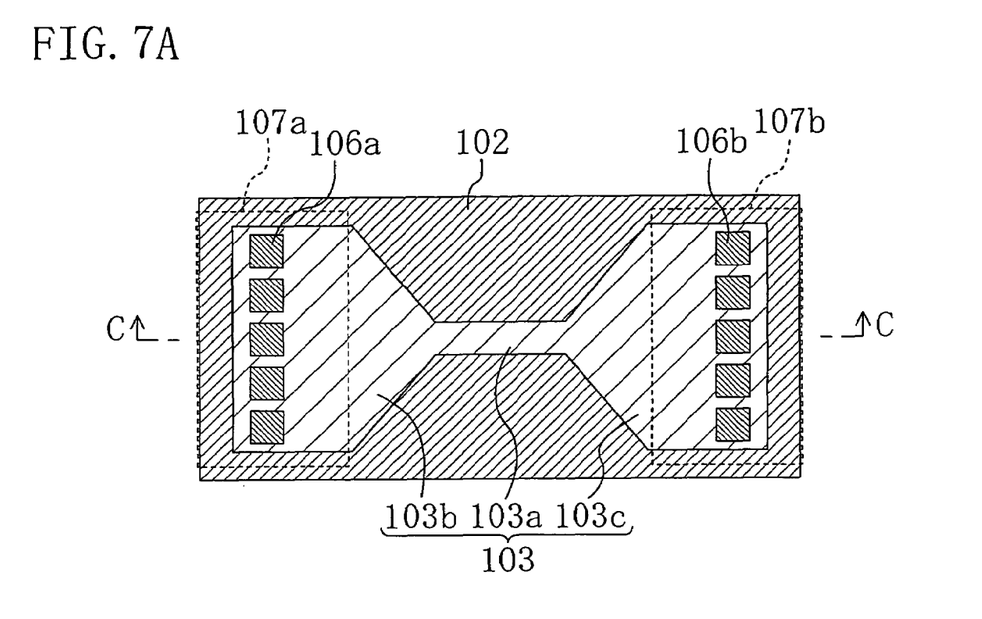
FIG. 7A is a plan view and FIG. 7B is a cross-sectional view taken along line C-C in FIG. 7A.
Figure 7B:
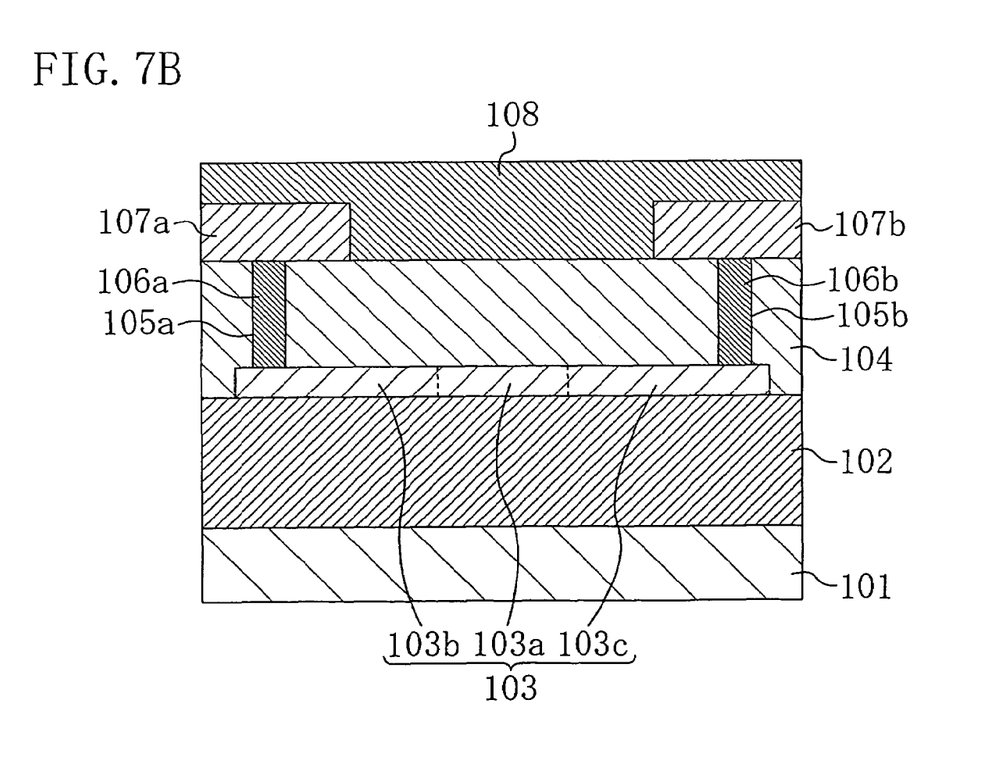

FIGS. 7A and 7B show a semiconductor device having a conventional electric fuse element. FIG. 7A is a plan view and FIG. 7B is a cross-sectional view taken along line C-C in FIG. 7A. Note that FIG. 7A does not show a first interlayer insulating film 104 and a second interlayer insulating film 108 shown in FIG. 7B. Metal wirings 107a, 107b are shown by dotted line in FIG. 7A.

Referring to the plan view of FIG. 7A, the conventional electric fuse element 103 is formed from a first region 103a, a second region 103b and a third region 103c. The first region 103a serves as a fuse portion. The second region 103b and the third region 103c are provided on both sides of the first region 103a, and each serves as a region where a contact is to be formed (hereinafter, referred to as a contact formation region). The first region 103a of the electric fuse element 103 has a narrower pattern width (a width in the vertical direction of the figure) than that of the second region 103b and the third region 103c. Five contact plugs 106a, 106b are provided in a row in the vertical direction of the figure on the second region 103b and the third region 103c, respectively.

Referring to the cross-sectional view of FIG. 7B, the semiconductor device having the conventional electric fuse element 103 includes a semiconductor substrate 101, an insulating film 102, an electric fuse element 103, a first interlayer insulating film 104, contact holes 105a, 105b, contact plugs 106a, 106b, metal wirings 107a, 107b, and a second interlayer insulating film 108. The insulating film 102 is formed on the semiconductor substrate 101. The electric fuse element 103 is formed on a part of the insulating film 102. The first interlayer insulating film 104 is formed on the insulating film 102 and the electric fuse element 103. The contact holes 105a, 105b extend through the first interlayer insulating film 104 to the second region 103b and the third region 103c, respectively, each of which serves as a contact formation region. The contact plugs 106a, 106b are formed from a conductive material such as tungsten, and fill the contact holes 105a, 105b, respectively. The metal wirings 107a, 107b are formed on a part of the first interlayer insulating film 104 so as to contact the contact plugs 106a, 106b, respectively. The second interlayer insulating film 108 is formed on the first interlayer insulating film 104 so as to cover the metal wirings 107a, 107b.

In the above conventional electric fuse element 103, however, it is hard to blow the first region 103a which serves as a fuse portion, and therefore a desired resistance value can not be obtained.

SUMMARY OF THE INVENTION

It is an object of the present invention to provide a semiconductor device having a fuse element whose electric resistance can be more reliably adjusted by facilitating blowing of a fuse portion, and a manufacturing method thereof.

A semiconductor device according to a first aspect of the present invention includes a first insulating film, a second insulating film, a fuse element, an interlayer insulating film, at least one first contact plug, at least one second contact plug, a first wiring, and a second wiring. The first insulating film is formed on a semiconductor substrate. The second insulating film is formed on a region of the semiconductor substrate which is adjacent to the first insulating film. The second insulating film is thinner than the first insulating film. The fuse element extends on the first insulating film and the second insulating film. The fuse element has a first region which serves as a fuse portion (a portion of the fuse element which has a higher electric resistance than that of the remaining portion, that is, a portion for blowing circuitry), a second region connected to one side of the first region, and a third region connected to another side of the first region. The interlayer insulating film is formed on the fuse element. The at least one first contact plug extends through the interlayer insulating film to the second region of the fuse element. The at least one second contact plug extends through the interlayer insulating film to the third region of the fuse element. The first wiring is formed on the interlayer insulating film and connected to the at least one first contact plug. The second wiring is formed on the interlayer insulating film and connected to the at least one second contact plug.

When a current is applied to the fuse element having the above structure, heat is generated in the fuse portion. This heat is released to the semiconductor substrate through the thin second insulating film. Because the semiconductor substrate has large thermal conductivity, a portion of the fuse element which is formed on the second insulating film is less likely to be heated. On the other hand, heat is less likely to transmit to the thick first insulating film. A portion of the fuse element which is formed on the first insulating film is therefore heated to a high temperature. This results in a large temperature difference between the portion of the fuse element which is formed on the second insulating film and the portion of the fuse element which is formed on the first insulating film. This increases a temperature change and a temperature gradient (i.e., a temperature distribution differentiated with respect to the length) in the first region serving as a fuse portion. Blowing of the first region is thus facilitated.

In the fuse element, a width (a width in the direction perpendicular to the direction in which a current is applied in the fuse element) of the first region is preferably narrower than a width of the second region and the third region. In this case, the first region has a higher resistance value. The first region is therefore more easily blown when a current is applied to the fuse element.

Preferably, the entire second region is formed on the first insulating film, and at least a part of the third region is formed on the second insulating film. In this case, the second region is more likely to be heated, while the part of the third region is less likely to be heated. This increases a temperature difference between the second region and the third region, and therefore increases a temperature change and a temperature gradient in the first region which is interposed between the second region and the third region.

A total plane area of the at least one second contact plug may be larger than a total plane area of the at least one first contact plug. In this case, a quantity of heat which is released through the second contact plug is larger than a quantity of heat which is released through the first contact plug. This further increases a temperature difference between the second region and the third region.

The semiconductor device according to the first aspect of the present invention may further include an element isolation insulating film formed on the semiconductor substrate, and a MIS (Metal Insulator Semiconductor) transistor having a gate insulating film and a gate electrode. The gate insulating film may be formed on a region of the semiconductor substrate which is surrounded by the element isolation insulating film. The gate electrode may be formed on the gate insulating film. The first insulating film and the element isolation insulating film may have a substantially same thickness. The second insulating film and the gate insulating film may have a substantially same thickness. The fuse element and the gate electrode may be formed from a same conductor material.

A semiconductor device according to a second aspect of the present invention includes an insulating film, a fuse element, an interlayer insulating film, at least one first contact plug, at least one second contact plug, a first wiring, and a second wiring. The insulating film is formed on a semiconductor substrate. The fuse element is formed on the insulating film, and has a first region which serves as a fuse portion, a second region connected to one side of the first region, and a third region connected to another side of the first region. The interlayer insulating film is formed on the fuse element. The at least one first contact plug extends through the interlayer insulating film to the second region of the fuse element. The at least one second contact plug extends through the interlayer insulating film to the third region of the fuse element. The first wiring is formed on the interlayer insulating film and connected to the at least one first contact plug. The second wiring is formed on the interlayer insulating film and connected to the at least one second contact plug. A total plane area of the at least one second contact plug is larger than a total plane area of the at least one first contact plug.

When a current is applied to the fuse element having the above structure, heat is generated in the fuse portion. This heat is released more from the second contact plug than from the first contact plug. The second region of the fuse element which is connected to the at least one first contact plug is therefore more likely to be heated, while the third region connected to the at least one second contact plug is less likely to be heated. This results in a large temperature difference between the second region and the third region. This increases a temperature change and a temperature gradient (i.e., a temperature distribution differentiated with respect to the length) in the first region interposed between the second and third regions. Blowing of the first region is thus facilitated.

More specifically, the total plane area of the at least one second contact plug can be made larger than the total plane area of the at least one first contact plug by providing a larger number of second contact plugs than a number of first contact plugs.

The total plane area of the at least one second contact plug can be made larger than the total plane area of the at least one first contact plug by making a plane area per second contact plug larger than a plane area per first contact plug.

A first distance from the first contact plug to the first region may be larger than a second distance from the second contact plug to the first region. This further increases the temperature difference between the second and third regions.

When a plurality of first contact plugs are provided, the first distance is preferably an average of respective distances from the first contact plugs to the first region. When a plurality of second contact plugs are provided, the second distance is preferably an average of respective distances from the second contact plugs to the first region. In the fuse element, a width of the first region is preferably narrower than a width of the second region and the third region. In this case, the first region has a higher resistance value. The first region is therefore more easily blown when a current is applied to the fuse element.

The semiconductor device according to the second aspect of the present invention may further includes an element isolation insulating film formed on the semiconductor substrate, and a MIS transistor having a gate insulating film and a gate electrode. The gate insulating film may be formed on a region of the semiconductor substrate which is surrounded by the element isolation insulating film. The gate electrode may be formed on the gate insulating film. The fuse element and the gate electrode may be formed from a same conductor material.

A semiconductor device according to a third aspect of the present invention includes an insulating film, a fuse element, an interlayer insulating film, at least one first contact plug, at least one second contact plug, a first wiring, and a second wiring. The insulating film is formed on a semiconductor substrate. The fuse element is formed on the insulating film. The fuse element has a first region which serves as a fuse portion, a second region connected to one side of the first region, and a third region connected to another side of the first region. The interlayer insulating film is formed on the fuse element. The at least one first contact plug extends through the interlayer insulating film to the second region of the fuse element. The at least one second contact plug extends through the interlayer insulating film to the third region of the fuse element. The first wiring is formed on the interlayer insulating film and connected to the at least one first contact plug. The second wiring is formed on the interlayer insulating film and connected to the at least one second contact plug. A first distance from the first contact plug to the first region is larger than a second distance from the second contact plug to the first region.

When a current is applied to the fuse element having the above structure, heat is generated in the fuse portion. This heat is released more from the second contact plug than from the first contact plug. The second region of the fuse element which is connected to the at least one first contact plug is therefore more likely to be heated, while the third region connected to the at least one second contact plug is less likely to be heated. This results in a large temperature difference between the second region and the third region. This increases a temperature change and a temperature gradient (i.e., a temperature distribution differentiated with respect to the length) in the first region interposed between the second and third regions: Blowing of the first region is thus facilitated.

When a plurality of first contact plugs are provided, the first distance is preferably an average of respective distances from the first contact plugs to the first region. When a plurality of second contact plugs are provided, the second distance is preferably an average of respective distances from the second contact plugs to the first region.

In the semiconductor device according to the first to third aspects of the present invention, the fuse element may be formed from a polysilicon film.

According to a first aspect of the present invention, a method for manufacturing a semiconductor device including a fuse element having a first region which serves as a fuse portion, a second region connected to one side of the first region, and a third region connected to another side of the first region includes the steps of: (a) forming a first insulating film on a semiconductor substrate; (b) forming a second insulating film thinner than the first insulating film on a region of the semiconductor substrate which is adjacent to the first insulating film; (c) forming the fuse element extending on the first insulating film and the second insulating film after the steps (a) and (b); (d) forming an interlayer insulating film on the fuse element after the step (c); (e) forming at least one first contact plug extending through the interlayer insulating film to the second region and at least one second contact plug extending through the interlayer insulating film to the third region after the step (d); and (f) forming on the interlayer insulating film a first wiring extending to the at least one first contact plug and a second wiring extending to the at least one second contact plug after the step (e).

When a current is applied to the fuse element of the semiconductor device manufactured by the above method, heat is generated in the fuse portion. This heat is released to the semiconductor substrate through the thin second insulating film. Because the semiconductor substrate has large thermal conductivity, a portion of the fuse element which is formed on the second insulating film is less likely to be heated. On the other hand, heat is less likely to transmit to the thick first insulating film. A portion of the fuse element which is formed on the first insulating film is therefore heated to a high temperature. This results in a large temperature difference between the portion of the fuse element which is formed on the second insulating film and the portion of the fuse element which is formed on the first insulating film. This increases a temperature change and a temperature gradient (i.e., a temperature distribution differentiated with respect to the length) in the first region serving as a fuse portion. Blowing of the first region is thus facilitated.

In the step (c), the fuse element is preferably formed so that a width of the first region is narrower than a width of the second region and the third region. In such a fuse element, the first region has a higher resistance value. The first region is therefore more easily blown when a current is applied to the fuse element.

In the step (c), the fuse element is preferably formed so that the entire second region is formed on the first insulating film and at least a part of the third region is formed on the second insulating film. In such a fuse element, the second region is more likely to be heated, while the part of the third region is less likely to be heated. This increases a temperature difference between the second region and the third region, and therefore increases a temperature change and a temperature gradient in the first region which is interposed between the second region and the third region.

According to a second aspect of the present invention, a method for manufacturing a semiconductor device including a fuse element having a first region which serves as a fuse portion, a second region connected to one side of the first region, and a third region connected to another side of the first region include the steps of: (a) forming an insulating film on a semiconductor substrate; (b) forming the fuse element on the insulating film after the step (a); (c) forming an interlayer insulating film on the fuse element after the step (b); (d) forming at least one first contact plug extending through the interlayer insulating film to the second region and at least one second contact plug extending through the interlayer insulating film to the third region after the step (c); and (e) forming on the interlayer insulating film a first wiring extending to the at least one first contact plug and a second wiring extending to the at least one second contact plug after the step (d). In the step (d), a total plane area of the at least one second contact plug is larger than a total plane area of the at least one first contact plug.

When a current is applied to the fuse element of the semiconductor device manufactured by the above method, heat is generated in the fuse portion. This heat is released more from the second contact plug than from the first contact plug. The second region of the fuse element which is connected to the at least one first contact plug is therefore more likely to be heated, while the third region connected to the at least one second contact plug is less likely to be heated. This results in a large temperature difference between the second region and the third region. This increases a temperature change and a temperature gradient (i.e., a temperature distribution differentiated with respect to the length) in the first region interposed between the second and third regions. Blowing of the first region is thus facilitated.

In the step (d), the total plane area of the at least one second contact plug can be made larger than the total plane area of the at least one first contact plug by forming a larger number of second contact plugs than a number of first contact plugs.

In the step (d), the total plane area of the at least one second contact plug can be made larger than the total plane area of the at least one first contact plug by making a plane area per second contact plug larger than a plane area per first contact plug.

In the step (d), a first distance from the first contact plug to the first region may be larger than a second distance from the second contact plug to the first region. This further increases the temperature difference between the second and third regions of the fuse element.

In the step (d), when a plurality of first contact plugs are provided, the first distance is preferably an average of respective distances from the first contact plugs to the first region. When a plurality of second contact plugs are provided, the second distance is preferably an average of respective distances from the second contact plugs to the first region.

In the step (b), the fuse element is preferably formed so that a width of the first region is narrower than a width of the second region and the third region. In such a fuse element, the first region has a higher resistance value. The first region is therefore more easily blown when a current is applied to the fuse element.

According to a third aspect of the present invention, a method for manufacturing a semiconductor device including a fuse element having a first region which serves as a fuse portion, a second region connected to one side of the first region, and a third region connected to another side of the first region includes the steps of: (a) forming an insulating film on a semiconductor substrate; (b) forming the fuse element on the insulating film after the step (a); (c) forming an interlayer insulating film on the fuse element after the step (b); (d) forming at least one first contact plug extending through the interlayer insulating film to the second region and at least one second contact plug extending through the interlayer insulating film to the third region after the step (c); and (e) forming on the interlayer insulating film a first wiring extending to the at least one first contact plug and a second wiring extending to the at least one second contact plug after the step (d). In the step (d), a first distance from the first contact plug to the first region is larger than a second distance from the second contact plug to the first region.

When a current is applied to the fuse element of the semiconductor device manufactured by the above method, heat is generated in the fuse portion. This heat is released more from the second contact plug than from the first contact plug. The second region of the fuse element which is connected to the at least one first contact plug is therefore more likely to be heated, while the third region connected to the at least one second contact plug is less likely to be heated. This results in a large temperature difference between the second region and the third region. This increases a temperature change and a temperature gradient (i.e., a temperature distribution differentiated with respect to the length) in the first region interposed between the second and third regions. Blowing of the first region is thus facilitated.

In the step (d), when a plurality of first contact plugs are provided, the first distance is preferably an average of respective distances from the first contact plugs to the first region. When a plurality of second contact plugs are provided, the second distance is preferably an average of respective distances from the second contact plugs to the first region.

BRIEF DESCRIPTION OF THE DRAWINGS

FIGS. 1A and 1B show a semiconductor device according to a first embodiment of the present invention, wherein

FIGS. 2A and 2B show the calculation result of a temperature distribution obtained when a current was applied to a fuse element according to the first embodiment of the present invention, wherein

FIGS. 4A and 4B show a semiconductor device according to a second embodiment of the present invention, wherein

FIGS. 5A and 5B show the structure of a modification of the second embodiment, wherein

FIGS. 7A and 7B show a semiconductor device having a conventional electric fuse element, wherein FIGS. 8A and 8B show the calculation result of a temperature distribution obtained when a current was applied to a conventional electric fuse element, wherein

DETAILED DESCRIPTION OF THE INVENTION

[Analysis Result]

Figure 8A:
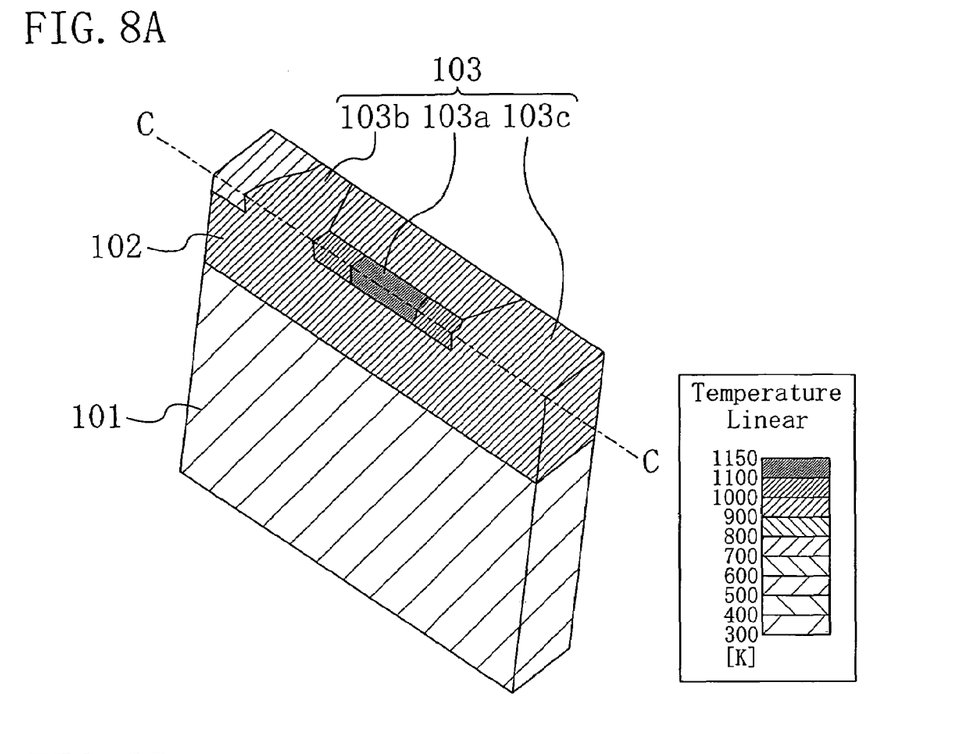
FIG. 8A is a perspective view showing the temperature distribution within the fuse element with each temperature range shown by a different hatching pattern.
Figure 8B:
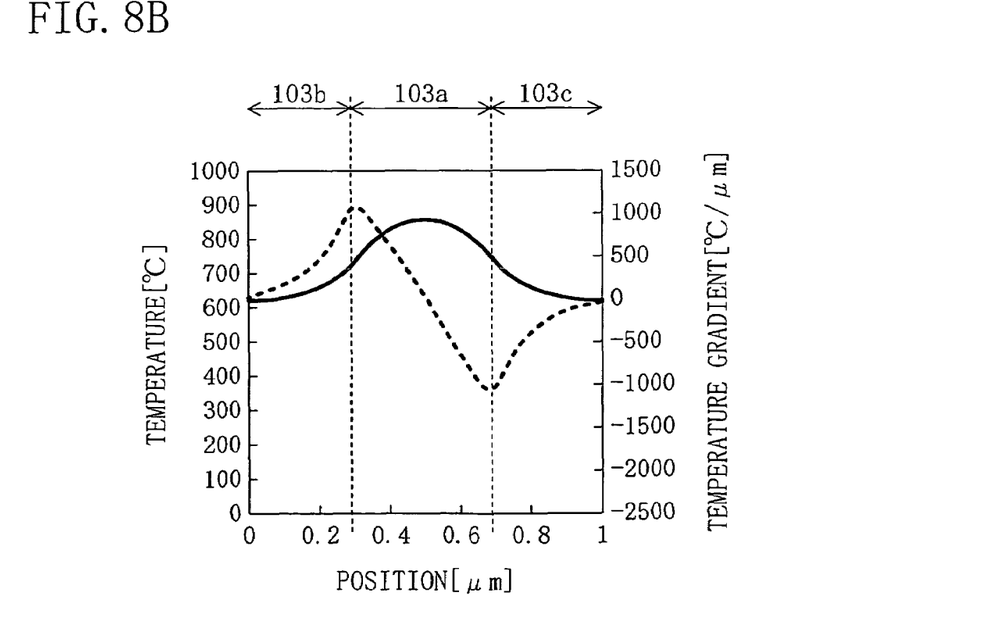
FIG. 8B is a graph showing the temperature distribution and temperature gradient along line C-C in FIG. 8A.

Hereinafter, the analysis result of a temperature distribution and the like which were obtained by applying a current to a conventional fuse element will be described with reference to FIGS. 8A and 8B. FIGS. 8A and 8B show the calculation result of a temperature distribution obtained when a current was applied to a conventional electric fuse element. FIG. 8A is a perspective view showing the temperature distribution within the fuse element with each temperature range shown by a different hatching pattern. FIG. 8B is a graph showing the temperature distribution and temperature gradient along line C-C in FIG. 8A. More specifically, FIG. 8A shows a temperature distribution which was obtained when the highest temperature within an electric fuse element 103 reached 800° C. (1,073K) as a result of applying a voltage of 1.25 V and a current of 0.5 mA to the electric fuse element 103. In this example, a polysilicon layer was used as the electric fuse element 103. FIG. 8B shows this temperature distribution and a corresponding temperature gradient. In FIG. 8B, a solid profile shows the temperature distribution and a dotted profile shows the temperature gradient.

As shown in FIG. 7B, the conventional electric fuse element 103 is surrounded by the first interlayer insulating film 104, the second interlayer insulating film 108 and the insulating film 102 which have small, uniform thermal conductivity. As shown in FIG. 8A, heat generated in the conventional electric fuse element 103 is therefore less likely to transmit in the upward, transverse and downward directions of the electric fuse element 103. The heat is therefore released intensively to the contact plugs 106a, 106b connected to both ends of the electric fuse element 103. As a result, as shown in FIG. 8B, the temperature within the electric fuse element 103 becomes highest in the central part of the first region 103a serving as a fuse portion, and becomes lowest at the ends of the second and third regions 103b, 103c to which the contact plugs 106a, 106b are connected. The temperature gradient gradually changes from the center of the first region 103a toward the ends of the second and third regions 103b, 103c.

In order for the electric fuse element 103 to blow, it is important that the electric fuse element 103 has a large temperature gradient as well as the temperature of the electric fuse element 103 is raised to the melting point of the electric fuse element 103. The temperature gradient is a temperature distribution within the electric fuse element 103 differentiated with respect to the length of the electric fuse element 103. In the conventional structure, however, heat is released mainly from both ends of the electric fuse element 103. Moreover, about the same quantity of heat is released from both ends of the electric fuse element 103. The overall temperature of the electric fuse element 103 therefore rises, resulting in a small temperature gradient within the electric fuse element 103. The electric fuse element 103 is therefore less likely to blow.

Based on the above analysis, the inventor found a method for increasing a temperature gradient within an electric fuse element. Hereinafter, embodiments of the present invention will be described with reference to the accompanying drawings.

First Embodiment

Figure 1A:
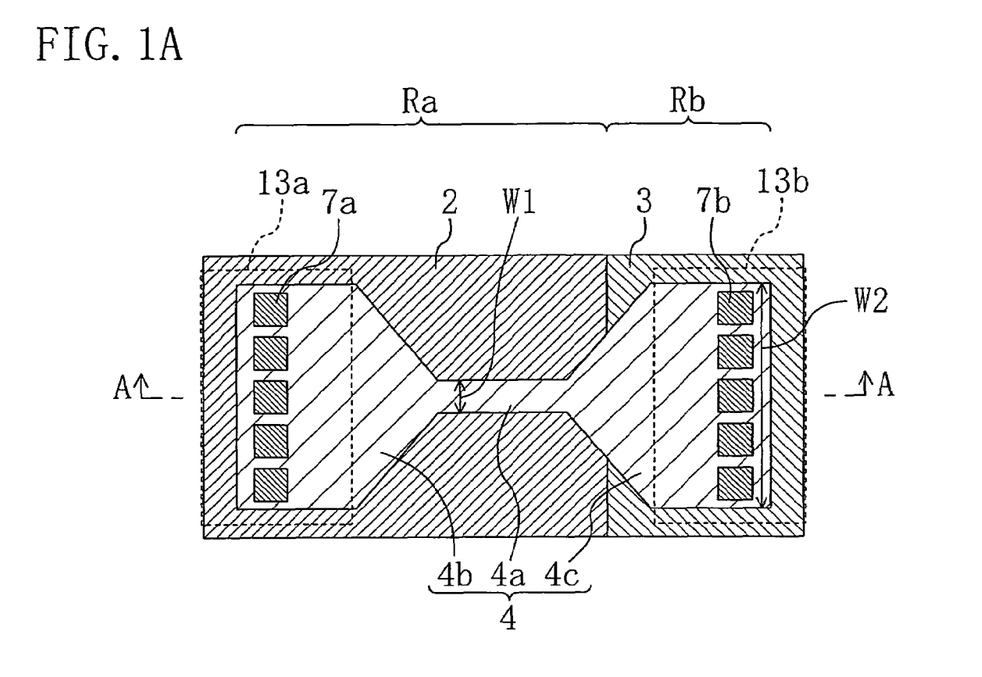
FIG. 1A is a plan view and FIG. 1B is a cross-sectional view taken along line A-A in FIG. 1A.
Figure 1B:
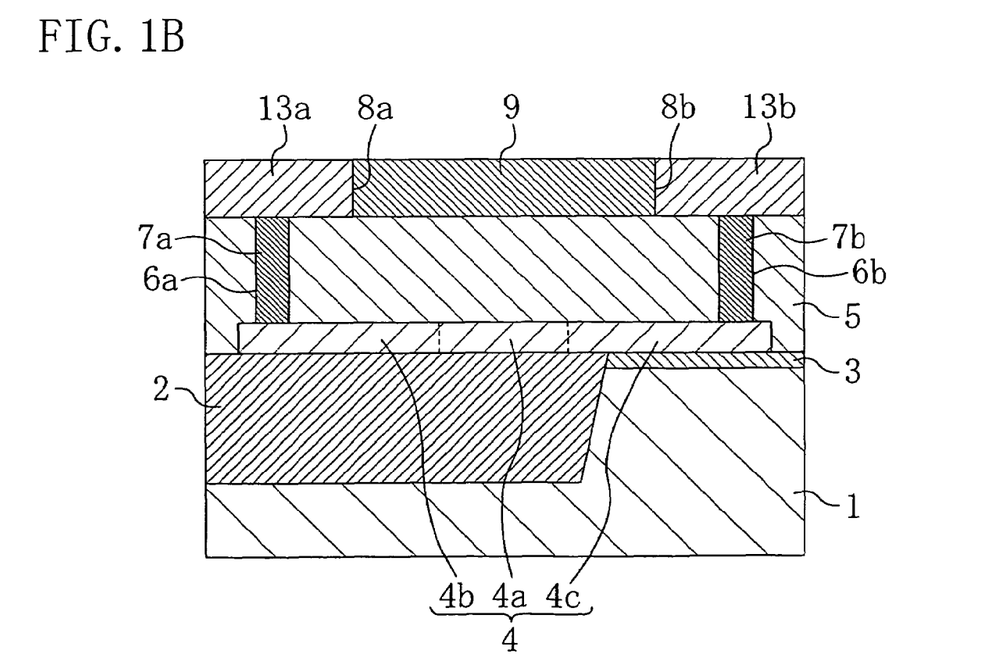

FIGS. 1A and 1B show a semiconductor device according to a first embodiment of the present invention. FIG. 1A is a plan view and FIG. 1B is a cross-sectional view taken along line A-A in FIG. 1A. Note that FIG. 1A does not show a first interlayer insulating film 5 and a second interlayer insulating film 9 shown in FIG. 1B. Metal wirings 13a, 13b are shown by dotted line in FIG. 1A.

Referring to the plan view of FIG. 1A, a fuse resistor (hereinafter, referred to as fuse element) 4 of the present embodiment includes a first region 4a, a second region 4b and a third region 4c. The first region 4a serves as a fuse portion. The second region 4b and the third region 4c are provided on both sides of the first region 4a and each serves as a region where a contact is to be formed (hereinafter, referred to as a contact formation region). A pattern width W1 of the first region 4a of the fuse element 4 is narrower than a pattern width W2 of the second region 4b and the third region 4c. For example, the pattern width W2 is about 1 μm, while the pattern width W1 is about 100 nm. In the present embodiment, each of the second region 4b and the third region 4c has a tapered portion whose width gradually increases from the joint portion with the first region 4a towards the opposite end. However, the second region 4b and the third region 4c need not necessarily have such a tapered portion. The second region 4b and the third region 4c may alternatively have a rectangular shape. A plurality of contact plugs 7a, 7b contact the second region 4b and the third region 4c, respectively.

Referring to the cross-sectional view of FIG. 1B, the semiconductor device of the present embodiment includes a semiconductor substrate 1, a thick insulating film 2 of 300 nm thick, a thin insulating film 3 of 10 nm thick, a fuse element 4 of 100 nm thick, a first interlayer insulating film 5 of 300 nm thick, contact plugs 7a, 7b of 100 nm in diameter, metal wirings 13a, 13b, and a second interlayer insulating film 9. The semiconductor substrate 1 is formed from silicon. The thick insulating film 2 is formed in a trench formed in the semiconductor substrate 1 by etching. The thin insulating film 3 is formed adjacent to the thick insulating film 2 on the semiconductor substrate 1. The fuse element 4 is formed on a part of the thick insulating film 2 and a part of the thin insulating film 3. The first interlayer insulating film 5 is formed on the semiconductor substrate 1 and the fuse element 4. The contact plugs 7a, 7b are formed from a conductive material such as tungsten. The contact plugs 7a, 7b extend through the first interlayer insulating film 5 to the second region 4b and the third region 4c of the fuse element 4, respectively. Each of the metal wirings 13a, 13b extends over the corresponding contact plugs 7a, 7b and a surrounding region of the first interlayer insulating film 5. The second interlayer insulating film 9 is formed between the metal wirings 13a, 13b on the first interlayer insulating film 5.

The fuse element 4 is formed from a semiconductor layer such as polysilicon or amorphous silicon, a metal layer such as Al or Cu, a laminated structure of a refractory metal layer such as Ti/TiN or Ta/TaN and a metal layer such as Al or Cu, or a laminated structure of a semiconductor layer and a silicide layer. The metal wirings 13a, 13b are formed from copper (Cu), aluminum (Al) or an aluminum alloy.

A primary feature of the present embodiment is that the fuse element 4 extends on the thick insulating film 2 and the thin insulating film 3 as shown in FIGS. 1A and 1B. In other words, the second region 4b and the first region 4a of the fuse element 4 extend on the thick insulating film 2, and the third region 4c of the fuse element 4 extends on the thick insulating film 2 and the thin insulating film 3. The portion of the fuse element 4 which extends on the thick insulating film 2, that is, the first region 4a, the second region 4b and a part of the third region 4c, is herein referred to as a thick film region Ra. On the other hand, the portion of the fuse element 4 which extends on the thin insulating film 3, that is, the remaining part of the third region 4c, is herein referred to as a thin film region Rb. Note that the thin insulating film 3 need not necessarily be formed in the whole region between the thin film region Rb of the third region 4c and the semiconductor substrate 1. However, it is desirable that the thin insulating film 3 be formed at least under the region where the contact plugs 7b are to be formed. The layout of the fuse element 4 is not limited to that shown in FIGS. 1A and 1B. For example, the fuse element 4 may alternatively be formed such that the second region 4b and a part of the first region 4a extend on the thick insulating film 2 and the remaining part of the first region 4a and the third region 4c extend on the thin insulating film 3.

Hereinafter, operation of the fuse element having the above structure will be described. The fuse element 4 has a greater resistance in the first region 4a because the first region 4a has a narrower pattern width. When a current is applied to the fuse element 4, the largest quantity of heat is therefore generated in the first region 4a. This heat is released to the outside through the second region 4b, the third region 4c and the contact plugs 7a, 7b. Because of the small thickness of the thin insulating film 3, the quantity of heat released to the thin film region Rb of the fuse element 4 is released to the semiconductor substrate 1 through the thin insulating film 3. On the other hand, because of the large thickness of the thick insulating film 2, the quantity of heat released to the thick film region Ra of the fuse element 4 is less likely to transmit to the semiconductor substrate 1 through the thick insulating film 2. Therefore, when a current is applied to the fuse element 4 by voltage application, the thin film region Rb of the fuse element 4 is heated to about room temperature, and the thick film region Ra of the fuse element 4 is heated to a high temperature.

Figure 2A:
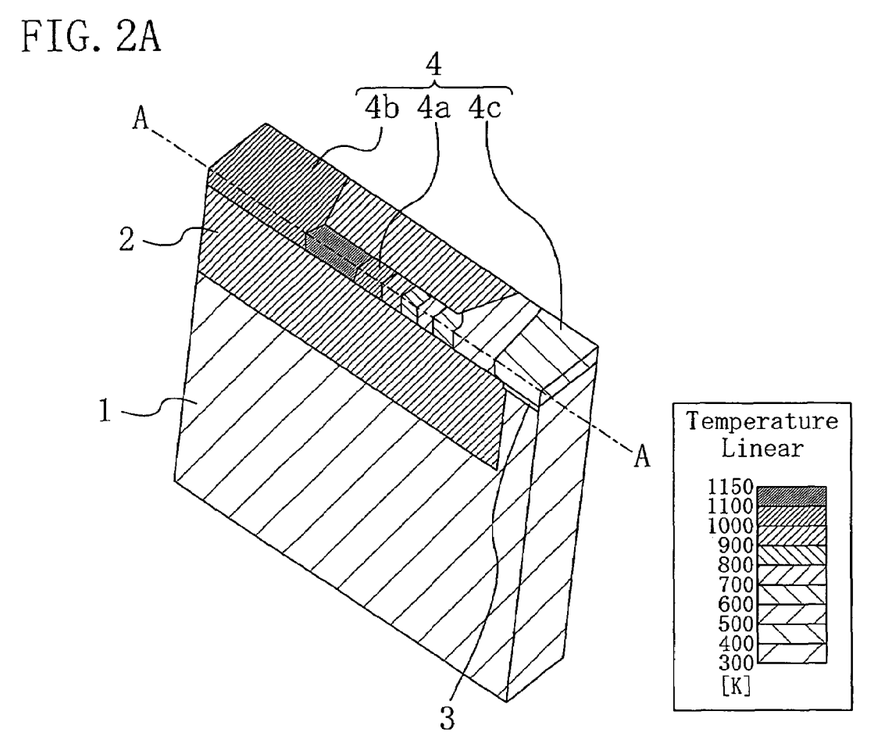
FIG. 2A is a perspective view showing the temperature distribution within the fuse element with each temperature range shown by a different hatching pattern.
Figure 2B:
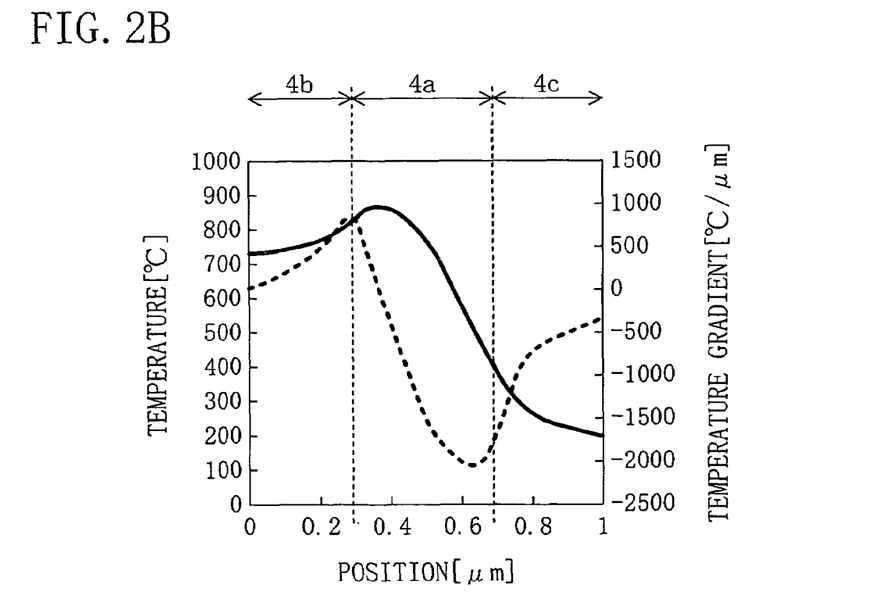
FIG. 2B is a graph showing the temperature distribution and temperature gradient along line A-A in FIG. 2A.

FIGS. 2A and 2B show the calculation result of a temperature distribution obtained when a current was applied to a fuse element according to the first embodiment of the present invention. FIG. 2A is a perspective view showing the temperature distribution within the fuse element with each temperature range shown by a different hatching pattern. FIG. 2B is a graph showing the temperature distribution and temperature gradient along line A-A in FIG. 2A. In this example, a polysilicon layer was used as a fuse element. More specifically, FIG. 2A shows a temperature distribution within the fuse element which was calculated when the highest temperature within the fuse element 4 reached 800° C. (1,073K) as a result of applying a voltage of 1.25 V and a current of 0.63 mA to the fuse element 4. FIG. 2B shows this temperature distribution and a corresponding temperature gradient. In FIG. 2B, a solid profile shows the temperature distribution and a dotted profile shows the temperature gradient.

As shown in FIGS. 2A and 2B, a part of the third region 4c which is formed on the thin insulating film 3 has a temperature of 200° C. (473K) because heat is released to the semiconductor substrate 1 through the thin insulating film 3. On the other hand, the second region 4b of the fuse element 4 which is formed on the thick insulating film 2 has a temperature of 800° C. (1,073K) because heat is less likely to be released to the semiconductor substrate 1 through the thick insulating film 2. The first region 4a having a narrower pattern width is formed between the second region 4b having a high temperature and the third region 4c having a low temperature. A part of the first region 4a therefore has a temperature of 800° C. (1,073K), the highest temperature in the fuse element 4, and the first region 4a has a temperature gradient as large as −2,000° C./μm. Such a steep temperature gradient in the first region 4a facilitates blowing of the fuse element 4.

According to the present embodiment, the thick insulating film 2 having a large thickness and the thin insulating film 3 having a small thickness are formed under the fuse element 4. Different quantities of heat are therefore released through the thick insulating film 2 and the thin insulating film 2 when a current is applied to the fuse element 4. This produces a large temperature gradient within the first region 4a which serves as a fuse portion, thereby facilitating electrical blowing of the fuse element 4.

Note that, in the present embodiment, the position of the largest temperature gradient can be adjusted by adjusting the distance from the boundary between the thin insulating film 3 and the thick insulating film 2 to the first region 4a which serves as a fuse portion. Although the first region 4a is already easily blown due to its narrower width than other regions, blowing of the first region 4a can further be facilitated by providing the largest temperature gradient within the first region 4a or within a part of the second region 4b which is close to the boundary with the first region 4a.

In the present embodiment, there is only one boundary between the thin insulating film 3 and the thick insulating film 2 under the fuse element 4. However, a plurality of boundaries between the thin insulating film 3 and the thick insulating film 2 may be provided under the fuse element 4 in order to produce a larger temperature gradient.

In order to blow the fuse element 4 of the present embodiment, a voltage of the same value (first voltage) is applied to the semiconductor substrate 1 and the contact plugs 7b formed above the thin insulating film 3 so that the contact plugs 7b and the semiconductor substrate 1 have the same potential. On the other hand, a voltage of a different value from the first voltage (second voltage) is applied to the contact plugs 7a formed above the thick insulating film 2. Especially when the second voltage is higher than the first voltage, the fuse element 4 can be blown without causing dielectric breakdown of the thin insulating film 3 having a small thickness.

Hereinafter, a manufacturing method of the semiconductor device according to the present embodiment will be described. FIGS. 3A through 3E are cross-sectional views illustrating a manufacturing process of the semiconductor device according to the first embodiment of the present invention. In FIGS. 3A through 3E, the left part of each figure is a region where a fuse element is to be formed (hereinafter, referred to as fuse element formation region AreaH), and the right part is a region where a transistor is to be formed (hereinafter, referred to as transistor formation region AreaT). Note that, in the present embodiment, an N-channel MIS (Metal Insulator Semiconductor) transistor is formed as a transistor.

Figure 3A:
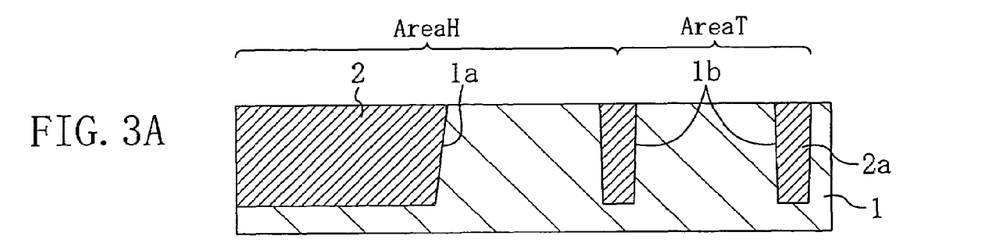
FIGS. 3A through 3E are cross-sectional views illustrating a manufacturing process of the semiconductor device according to the first embodiment of the present invention.

In the step of FIG. 3A, dry etching is conducted to the semiconductor substrate 1. More specifically, a part of the fuse element formation region AreaH of the semiconductor substrate 1 is removed to a desired depth to form a first groove 1a. At the same time, a part of the transistor formation region AreaT which surrounds an active region of a transistor is removed to a desired depth to form a second groove 1b. An insulating film (not shown) such as a silicon oxide film is then deposited on the semiconductor substrate 1 in order to fill the first groove 1a and the second groove 1b. An unnecessary portion of the insulating film, that is, a portion of the insulating film which is formed over the top surface of the semiconductor substrate 1, is then removed by a CMP (Chemical Mechanical Polishing) method. As a result, a thick insulating film 2 is formed in the first groove 1a, and an element isolation insulating film 2a is formed in the second groove 1b.

Figure 3B:
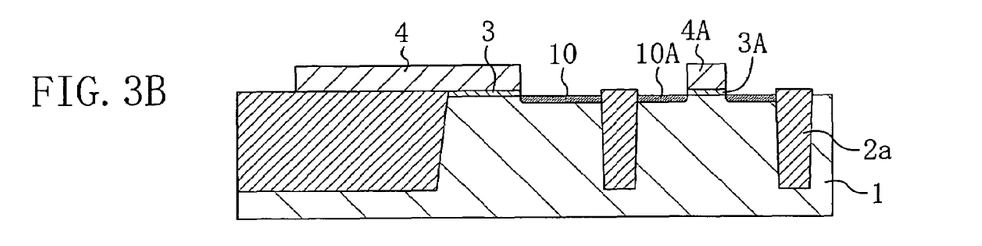

It is desirable that the respective top surfaces of the thick insulating film 2 and the element isolation insulating film 2a be approximately flush with, or slightly higher than, the surface of the semiconductor substrate 1. In the step of FIG. 3B, an insulating film of 10 nm thick (not shown) is formed on the semiconductor substrate 1. This insulating film will serve as a thin insulating film 3 in a region of the fuse element formation region AreaH which is adjacent to the thick insulating film 2, and will serve as a gate insulating film 3A in the active region of the transistor formation region AreaT. A polysilicon film of 100 nm thick (not shown) is then deposited on the insulating film. After the polysilicon film is patterned by photolithography and dry etching, an exposed part of the insulating film is removed. As a result, a fuse element 4 is formed which extends on the thick insulating film 2 and the thin insulating film 3. At the same time, a gate electrode 4A is formed on the gate insulating film 3A.

The thin insulating film 3 need not necessarily be formed by the same step as the gate insulating film 3A. The thin insulating film 3 may be formed by thermally oxidizing the surface of the semiconductor substrate 1 or by depositing an insulating film by a CVD (Chemical Vapor Deposition) method. The thin insulating film 3 may be any one of a silicon oxide film, a silicon oxynitride film, a metal oxide film and the like. In this example, an exposed part of the insulating film is removed after patterning the polysilicon film. In other words, the insulating film is entirely removed except the regions which will serve as the thin insulating film 3 and the gate insulating film 3A. However, the exposed part of the insulating film need not necessarily be removed.

Thereafter, an n-type extension diffusion layer 10A is formed in the transistor formation region AreaT of the semiconductor substrate 1 by implanting arsenic (As) ions (n-type impurities) at $5 \times 10^{14}$ ions/cm$^2$ and 5 keV by using the gate electrode 4A as a mask. In this ion implantation, arsenic ions are also implanted into the fuse element 4 and an exposed region of the semiconductor substrate 1. As a result, an n-type impurity diffusion region 10 is formed in the exposed region of the semiconductor substrate 1. Resistance of the fuse element 4 can be adjusted by implanting arsenic ions into the fuse element 4.

Figure 3C:
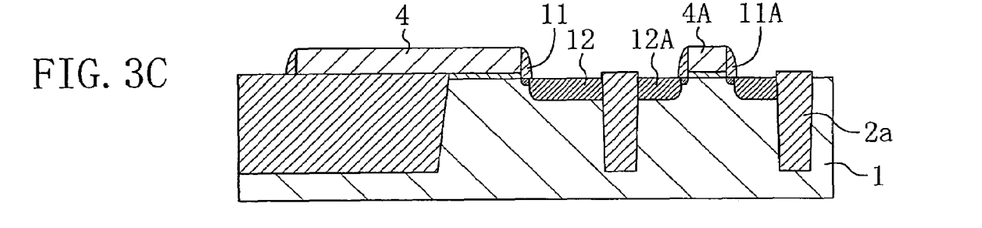

In the step of FIG. 3C, an insulating film (not shown) is deposited on the whole surface of the semiconductor substrate 1. The insulating film is then etched back by anisotropic dry etching to form a first sidewall 11 on the side surface of the fuse element 4 and a second sidewall 11A on the side surface of the gate electrode 4A. Arsenic (As) ions (n-type impurities) are then implanted at $5 \times 10^{15}$ ions/cm$^2$ and 50 keV by using the gate electrode 4A and the second sidewall 11A as a mask. As a result, an n-type source/drain diffusion layer 12A is formed in the transistor formation region AreaT of the semiconductor substrate 1. In this ion implantation, arsenic ions are also implanted into the fuse element 4 and an exposed region of the semiconductor substrate 1. As a result, an impurity diffusion region 12 is formed in the exposed region of the semiconductor substrate 1.

Figure 3D:
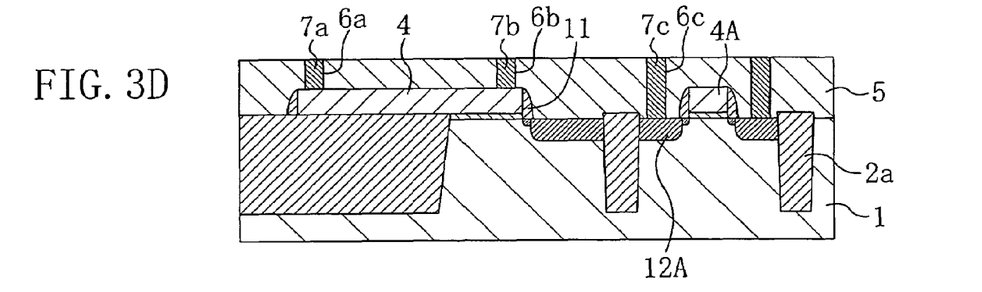

In the step of FIG. 3D, a first interlayer insulating film 5 is formed on the semiconductor substrate 1. The first interlayer insulating film 5 is a silicon oxide film, a fluorine-containing oxide film (FSG (Fluorinated Silicate Glass) film), or the like. The surface of the first interlayer insulating film 5 is then planarized by a CMP method. Contact holes 6a, 6b extending to the surface of the fuse element 4 are formed by etching away a part of the first interlayer insulating film 5. A contact hole 6c extending to the surface of the n-type source/drain diffusion layer 12A is also formed at the same time. This dry etching process for forming the contact holes 6a, 6b, 6c in the first interlayer insulating film 5 is conducted by using CF$_4$ or the like as etching gas. The use of such etching gas enables the first interlayer insulating film 5 to be etched at a different rate from polysilicon of the fuse element 4 and silicon of the semiconductor substrate 1. The fuse element 4 and the semiconductor substrate 1 are therefore less likely to be etched away even when the contact holes 6a, 6b, 6c reach the fuse element 4 and the semiconductor substrate 1 during the etching process. A tungsten film (not shown) is then formed on the first interlayer insulating film 5 by a CVD method in order to fill the contact holes 6a, 6b, 6c. An unnecessary part of the tungsten film on the first interlayer insulating film 5 is then removed by a CMP method. Contact plugs 7a, 7b, 7c are thus formed in the contact holes 6a, 6b, 6c, respectively.

Figure 3E:
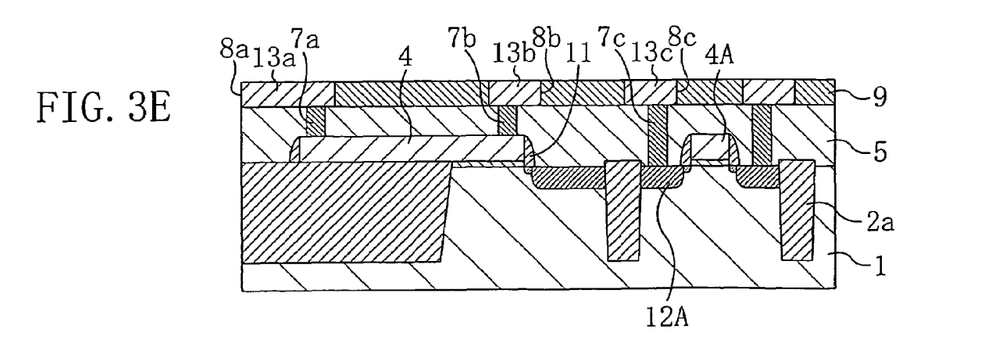

In the step of FIG. 3E, a second interlayer insulating film 9 is formed on the first interlayer insulating film 5 including the contact plugs 7a, 7b, 7c. A part of the second interlayer insulating film 9 is then etched away to form wiring grooves 8a, 8b, 8c which extend to the contact plugs 7a, 7b, 7c, respectively. A copper film (not shown) is then formed on the second interlayer insulating film 9 including the wiring grooves 8a, 8b, 8c by an electroplating method. An unnecessary part of the copper film on the second interlayer insulating film 9 is removed by a CMP method. Metal wirings 13a, 13b, 13c of the copper film are thus formed in the wiring grooves 8a, 8b, 8c, respectively. In the present embodiment, the metal wirings are formed by a so-called single damascene method. However, the metal wirings may be formed by forming a metal film on the first interlayer insulating film 5 and etching the metal film. Alternatively, the contact plugs and the metal wirings may be formed simultaneously by a dual damascene method.

In the present embodiment, the impurity diffusion layers 10, 12 are formed in the fuse element formation region AreaH of the semiconductor substrate 1 in the steps of FIGS. 3B, 3C. However, the impurity diffusion layers 10, 12 need not necessarily be formed. In the case where the impurity diffusion layers 10, 12 are not formed, the following process need only be conducted in the steps of FIGS. 3B, 3C: an ion implantation mask which covers the fuse element formation region AreaH is formed from a resist or the like, and ion implantation is conducted to form an n-type extension diffusion layer 10A or an n-type source/drain diffusion layer 12A, respectively.

In the present embodiment, arsenic ions are implanted into the fuse element 4 simultaneously with forming the n-type extension diffusion layer 10A in the transistor formation region AreaT of the semiconductor substrate 1 in the step of FIG. 3B. However, implantation of arsenic ions into the fuse element 4 and formation of the n-type extension diffusion layer 10A may be conducted in different steps. Moreover, arsenic ions are implanted into the fuse element 4 simultaneously with forming the n-type source/drain diffusion layer 12A in the transistor formation region AreaT of the semiconductor substrate 1 in the step of FIG. 3C. However, implantation of arsenic ions into the fuse element 4 and formation of the n-type source/drain diffusion layer 12A may be conducted in different steps.

In the present embodiment, a polysilicon film was used as the fuse element 4.

However, the present invention is not limited to this. For example, the fuse element 4 may have a laminated structure of a polysilicon film and a silicide film formed on the polysilicon film. This laminated structure may be formed by forming, e.g., a cobalt silicide film on an exposed region of the semiconductor substrate 1 and polysilicon by a salicide technique after forming the n-type source/drain diffusion layer 12A and the impurity diffusion layer 12 in the step of FIG. 3C. By such silicidation, a cobalt silicide film is formed also on the gate electrode 4A and the n-type source/drain diffusion layer 12A. Note that such a cobalt silicide film may be or may not be formed on the impurity diffusion layer 12.

Second Embodiment

Figure 4A:
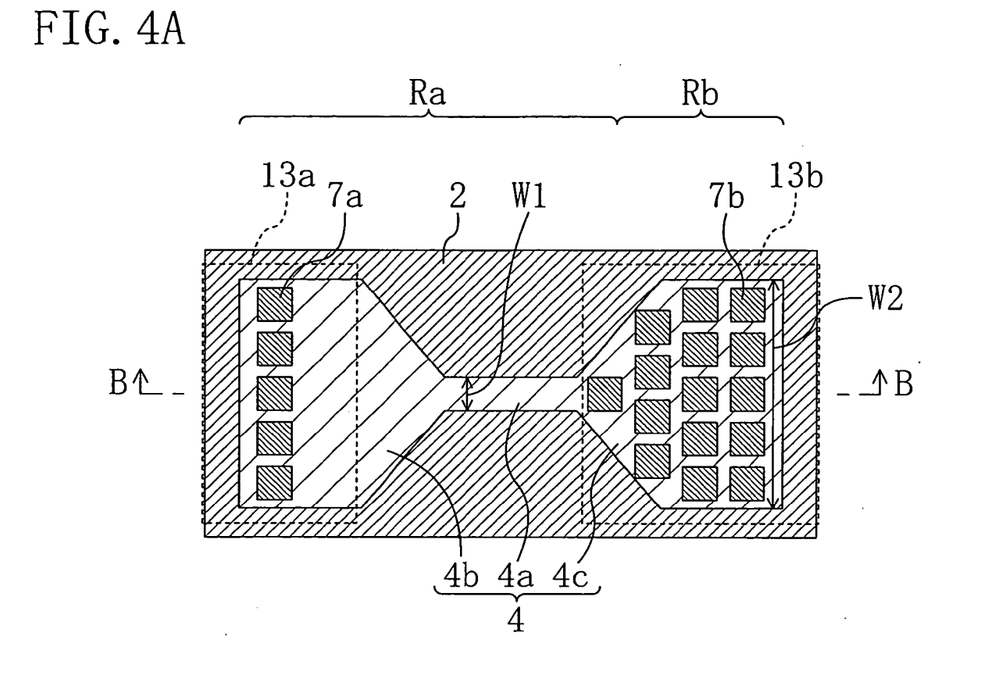
FIG. 4A is a plan view and FIG. 4B is a cross-sectional view taken along line B-B in FIG. 4A.
Figure 4B:
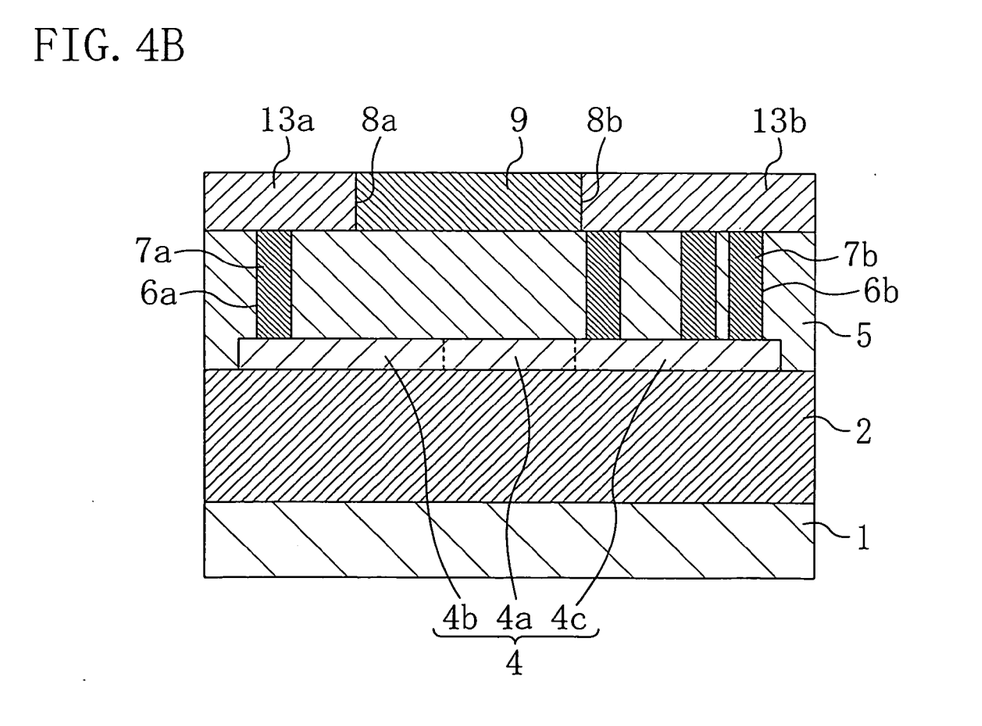

FIGS. 4A and 4B show a semiconductor device according to a second embodiment of the present invention. FIG. 4A is a plan view and FIG. 4B is a cross-sectional view taken along line B-B in FIG. 4A. Note that FIG. 4A does not show a first interlayer insulating film 5 and a second interlayer insulating film 9 shown in FIG. 4B. Metal wirings 13a, 13b are shown by dotted line in FIG. 4A.

Referring to the plan view of FIG. 4A, a fuse resistor (hereinafter, referred to as fuse element) 4 of the present embodiment includes a first region 4a, a second region 4b and a third region 4c. The first region 4a serves as a fuse portion. The second region 4b and the third region 4c are provided on both sides of the first region 4a and each serves as a region where a contact is to be formed (hereinafter, referred to as a contact formation region). A pattern width W1 of the first region 4a of the fuse element 4 is narrower than a pattern width W2 of the second region 4b and the third region 4c. For example, the pattern width W2 is about 1 μm, while the pattern width W1 is about 100 nm. In the present embodiment, each of the second region 4b and the third region 4c has a tapered portion whose width gradually increases from the joint portion with the first region 4a towards the opposite end. However, the second region 4b and the third region 4c need not necessarily have such a tapered portion. The second region 4b and the third region 4c may alternatively have a rectangular shape. A plurality of contact plugs 7a, 7b contact the second region 4b and the third region 4c, respectively.

Referring to the cross-sectional view of FIG. 4B, the semiconductor device of the present embodiment includes a semiconductor substrate 1, a thick insulating film 2 of 300 nm thick, a fuse element 4 of 100 nm thick, a first interlayer insulating film 5, contact plugs 7a, 7b of 100 nm in diameter, metal wirings 13a, 13b, and a second interlayer insulating film 9. The thick insulating film 2 is formed in a trench formed in the semiconductor substrate 1 by etching. The fuse element 4 is formed on the thick insulating film 2. The first interlayer insulating film 5 is formed on the semiconductor substrate 1 and the fuse element 4. The contact plugs 7a, 7b are formed from a conductive material such as tungsten. The contact plugs 7a, 7b extend through the first interlayer insulating film 5 to the second region 4b and the third region 4c of the fuse element 4, respectively. Each of the metal wirings 13a, 13b extends over the corresponding contact plugs 7a, 7b and a surrounding region of the first interlayer insulating film 5. The second interlayer insulating film 9 is formed between the metal wirings 13a, 13b on the first interlayer insulating film 5.

The fuse element 4 is formed from a semiconductor layer such as polysilicon or amorphous silicon, a metal layer such as Al or Cu, a laminated structure of a refractory metal layer such as Ti/TiN or Ta/TaN and a metal layer such as Al or Cu, or a laminated structure of a semiconductor layer and a silicide layer. The metal wirings 13a, 13b are formed from copper (Cu), aluminum (Al) or an aluminum alloy.

A primary feature of the present embodiment is that, as shown in FIGS. 4A and 4B, the number of contact plugs 7a connected to the second region 4b of the fuse element 4 is different from that of contact plugs 7b connected to the third region 4c. More specifically, five contact plugs 7a are formed on the second region 4b, one of the contact formation regions at both ends of the fuse element 4, while fifteen contact plugs 7b are formed on the third region 4c, the other contact formation region. Moreover, an average of respective distances from the first region 4a serving as a fuse portion of the fuse element 4 to the contact plugs 7b is shorter than that of respective distances from the first region 4a to the contact plugs 7a. In this structure, the quantity of heat which transmits to the contact plugs 7b is larger than that which transmits to the contact plugs 7a. As a result, one side of the first region 4a which is closer to the contact plugs 7b has a reduced temperature. Therefore, the first region 4a which serves as a fuse portion of the fuse element 4 has a large temperature gradient, thereby facilitating blowing of the first region 4a.

According to the present embodiment, adjusting the numbers and positions of contact plugs 7a, 7b connected to both ends of the fuse element enables different quantities of heat to be released from both ends of the first region 4a serving as a fuse portion. This enables the first region 4a serving as a fuse portion to have a larger temperature gradient, thereby facilitating electrical blowing of the first region 4a.

In the present embodiment, not all of the contact plugs which are larger in number and in a quantity of heat which is released thereto may be electrically connected to the third region 4c of the fuse element 4. In other words, not all of the contact plugs 7b may be electrically connected to the third region 4c of the fuse element 4. More specifically, an insulating film such as the first interlayer insulating film 5 may be interposed between at least one of the contact plugs 7b and the third region 4c. Preferably, such an insulating film between at least one of the contact plugs 7b and the third region 4c has a thickness of 10 nm or less so that heat of the fuse element 4 can be transmitted to that contact plug 7b. Moreover, not all of the contact plugs 7b may be electrically connected to the metal wiring 13b. More specifically, an insulating film such as the first interlayer insulating film 5 and the second interlayer insulating film 9 may be interposed between at least one of the contact plugs 7b and the metal wiring 13b.

Figure 5A:
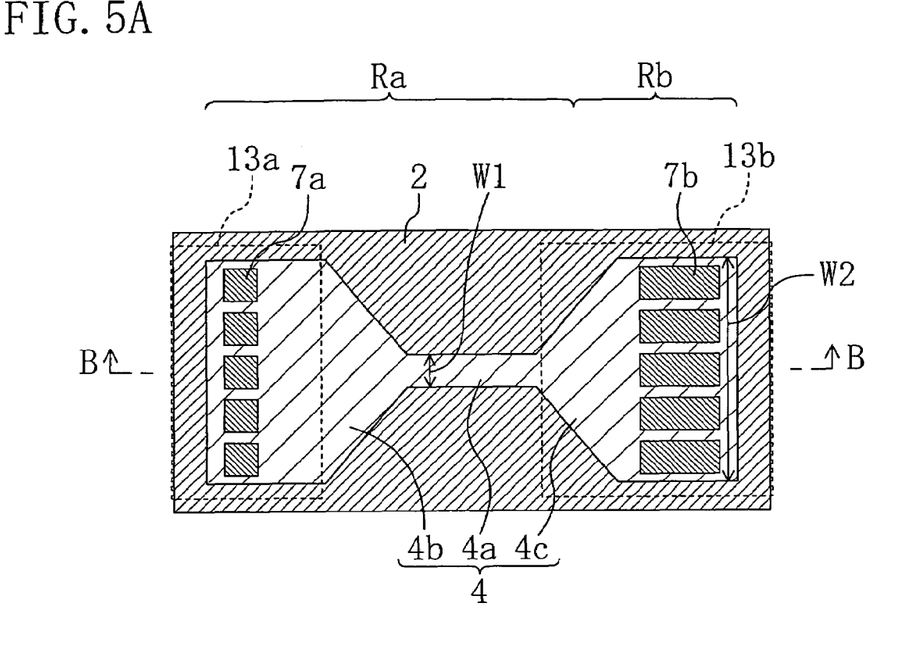
FIG. 5A is a plan view and FIG. 5B is a cross-sectional view taken along line B-B in FIG. 5A.
Figure 5B:
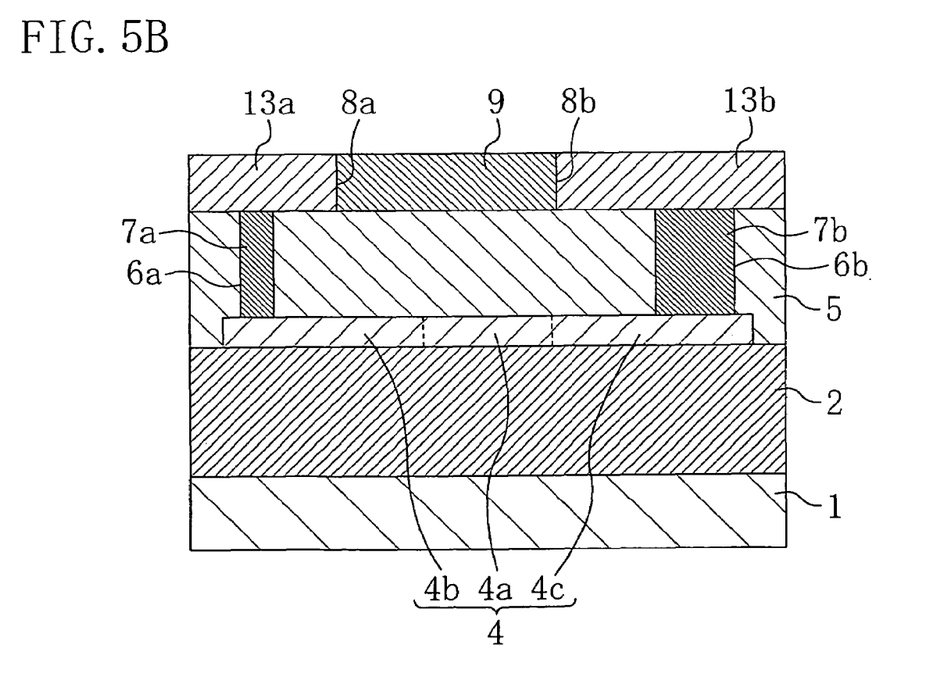

In the present embodiment, the number of contact plugs 7a is different from that of contact plugs 7b in order to make the total plane area of the contact plugs 7a different from that of the contact plugs 7b and thus to make the quantity of heat which is released from the contact plugs 7a different from that which is released from the contact plugs 7b. In order to achieve these purposes, the same numbers of contact plugs 7a and contact plugs 7b may alternatively be provided by making the plane area per contact plug 7a different from that per contact plug 7b, as shown in FIGS. 5A and 5B. FIGS. 5A and 5B show the structure of such a modification of the second embodiment. FIG. 5A is a plan view and FIG. 5B is a cross-sectional view taken along line B-B in FIG. 5A. This modification provides the same effects as those obtained by providing different numbers of contact plugs 7a and contact plugs 7b.

According to the present embodiment, the metal wiring 13b may be thicker than the metal wiring 13a so that the metal wiring 13b has a larger cross-sectional area than that of the metal wiring 13a. In this case, an increased quantity of heat is released to the outside through the metal wiring 13b connected to the contact plugs 7b, thereby increasing the temperature difference between the second region 4b and the third region 4c of the fuse element 4. This increases a temperature gradient in the first region 4a of the fuse element 4.

In the present embodiment, the fuse element 4 is formed on the thick insulating film 2. Like the first embodiment, however, the fuse element 4 may be formed on the thick insulating film 2 and the thin insulating film 3 (shown in FIGS. 1A and 1B). This increases the temperature difference between the ends of the first region 4a which serves as a fuse portion of the fuse element 4. In other words, the first region 4a has a greater temperature gradient. This facilitates electrical blowing of the fuse element 4. In the present embodiment, the number of contact plugs 7a is different from that of contact plugs 7b and the distance from the first region 4a of the fuse element 4 to the contact plugs 7a is different from that from the first region 4a to the contact plugs 7b. However, only one of the number and the distance may be different between the contact plugs 7a and 7b.

Hereinafter, a manufacturing method of the semiconductor device according to the second embodiment will be described. FIGS. 6A through 6E are cross-sectional views illustrating a manufacturing process of the semiconductor device according to the second embodiment of the present invention. In FIGS. 6A through 6E, the left part of each figure is a region where a fuse element is to be formed (hereinafter, referred to as a fuse element formation region AreaH), and the right part is a region where a transistor is to be formed (hereinafter, referred to as a transistor formation region AreaT). Note that, in the present embodiment, an N-channel MIS transistor is used as a transistor.

Figure 6A:
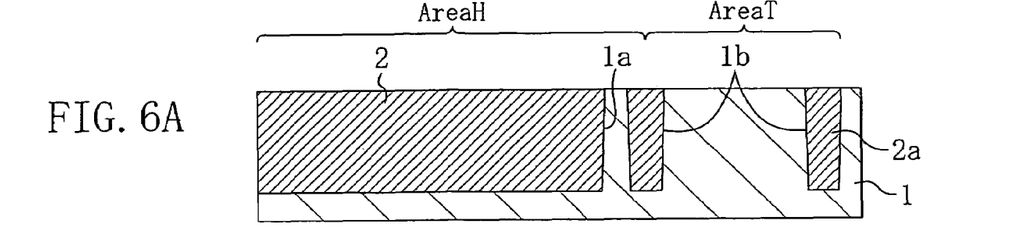
FIGS. 6A through 6E are cross-sectional views illustrating a manufacturing process of the semiconductor device according to the second embodiment of the present invention.

In the step of FIG. 6A, dry etching is conducted to the semiconductor substrate 1. More specifically, a part of the fuse element formation region AreaH of the semiconductor substrate 1 is removed to a desired depth to form a first groove 1a. At the same time, a part of the transistor formation region AreaT which surrounds an active region of a transistor is removed to a desired depth to form a second groove 1b. An insulating film (not shown) such as a silicon oxide film is then deposited on the semiconductor substrate 1 in order to fill the first groove 1a and the second groove 1b. An unnecessary portion of the insulating film, that is, a portion of the insulating film which is formed over the top surface of the semiconductor substrate 1, is then removed by a CMP (Chemical Mechanical Polishing) method. As a result, a thick insulating film 2 is formed in the first groove 1a in the fuse element formation region AreaH, and an element isolation insulating film 2a is formed in the second groove 1b in the transistor formation region AreaT. It is desirable that the respective top surfaces of the thick insulating film 2 and the element isolation insulating film 2a be approximately flush with, or slightly higher than, the surface of the semiconductor substrate 1.

Figure 6B:
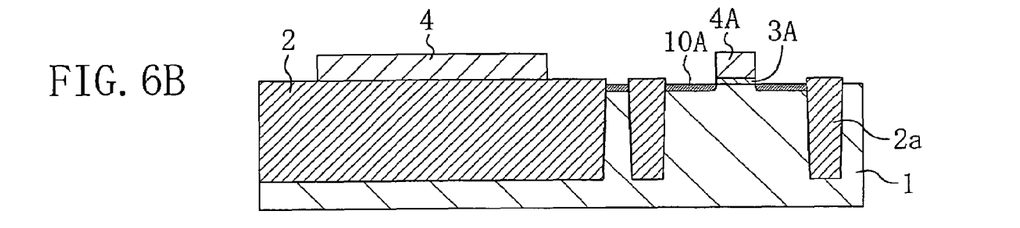

In the step of FIG. 6B, a gate insulating film 3A is formed on the active region in the transistor formation region AreaT of the semiconductor substrate 1. The gate insulating film 3A may be any of a silicon oxide film, a silicon oxynitride film, a metal oxide film and the like. A polysilicon film (not shown) is then deposited on the semiconductor substrate 1. The polysilicon film is patterned by photolithography and dry etching to form a fuse element 4 on the thick insulating film 2 in the fuse element formation region AreaH and to form a gate electrode 4A on the gate insulating film 3A in the transistor formation region AreaT. In the present embodiment, an exposed part of the gate insulating film 3A is removed after patterning the polysilicon film. However, such an exposed part of the gate insulating film 3A need not necessarily be removed. Thereafter, an n-type extension diffusion layer 10A is formed in the transistor formation region AreaT of the semiconductor substrate 1 by implanting arsenic (As) ions (n-type impurities) at $5 \times 10^{14}$ ions/cm$^2$ and 50 keV by using the gate electrode 4A as a mask.

Figure 6C:
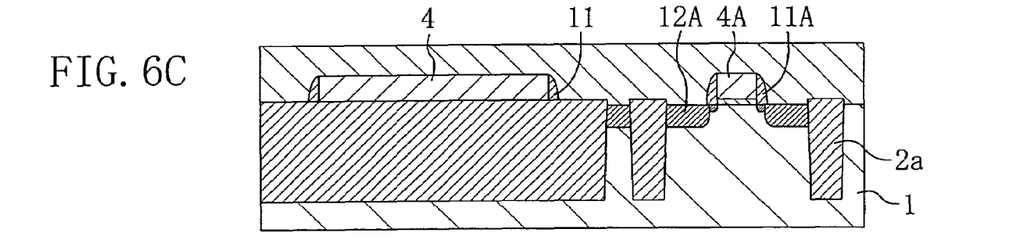

In the step of FIG. 6C, an insulating film (not shown) is deposited on the whole surface of the semiconductor substrate 1. The insulating film is then etched back by anisotropic dry etching to form a first sidewall 11 on the side surface of the fuse element 4 and a second sidewall 11A on the side surface of the gate electrode 4A.

Arsenic (As) ions (n-type impurities) are then implanted at $5 \times 10^{15}$ ions/cm$^2$ and 50 keV by using the gate electrode 4A and the second sidewall 11A as a mask. As a result, an n-type source/drain diffusion layer 12A is formed in the transistor formation region AreaT of the semiconductor substrate 1. In this ion implantation, arsenic ions are also implanted into the fuse element 4 formed in the fuse element formation region AreaH of the semiconductor substrate 1.

Figure 6D:
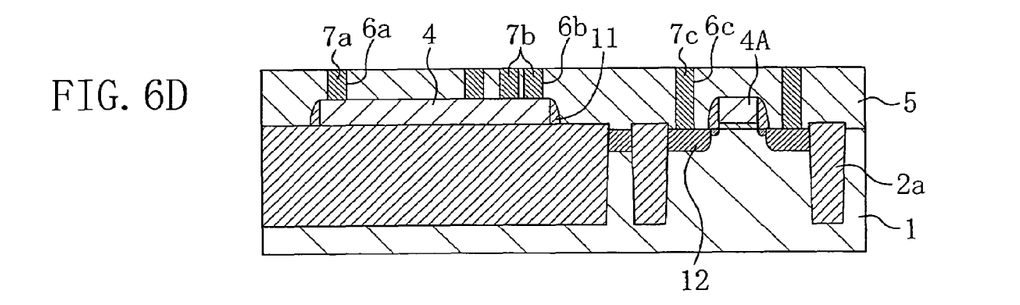

In the step of FIG. 6D, a first interlayer insulating film 5 is formed on the semiconductor substrate 1. The first interlayer insulating film 5 is a silicon oxide film, a fluorine-containing oxide film (FSG (Fluorinated Silicate Glass) film), or the like. The surface of the first interlayer insulating film 5 is then planarized by a CMP method. Contact holes 6a, 6b extending to the surface of the fuse element 4 are formed by etching away a part of the first interlayer insulating film 5. This etching process is conducted using the same etching conditions as those of the first embodiment. The number of contact holes 6a is larger than that of contact holes 6b. In the present embodiment, five contact holes 6a and fifteen contact holes 6b are formed. Note that a contact hole 6c extending to the surface of the n-type source/drain diffusion layer 12A is formed simultaneously with the contact holes 6a, 6b.

A tungsten film (not shown) is then formed on the first interlayer insulating film 5 by a CVD method in order to fill the contact holes 6a, 6b, 6c. An unnecessary part of the tungsten film on the first interlayer insulating film 5 is then removed by a CMP method. Contact plugs 7a, 7b, 7c are thus formed in the contact holes 6a, 6b, 6c, respectively. Five contact plugs 7a and fifteen contact plugs 7b are formed in the present embodiment.

Figure 6E:
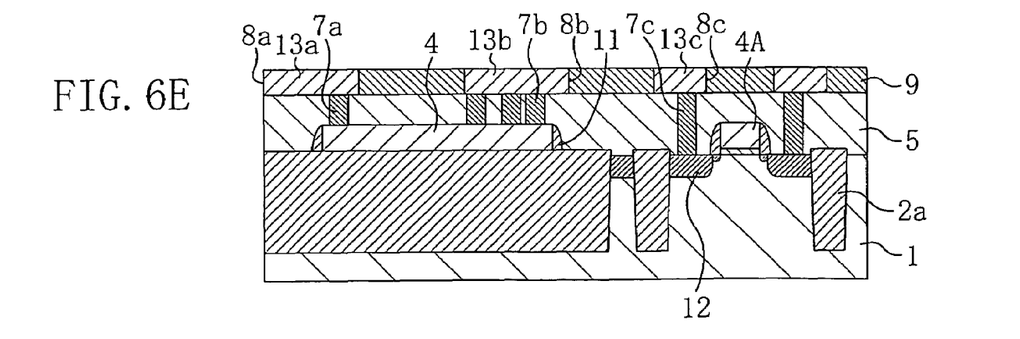

In the step of FIG. 6E, a second interlayer insulating film 9 is formed on the first interlayer insulating film 5 including the contact plugs 7a, 7b, 7c. A part of the second interlayer insulating film 9 is then etched away to form wiring grooves 8a, 8b, 8c which extend to the contact plugs 7a, 7b, 7c, respectively. A copper film (not shown) is then formed on the second interlayer insulating film 9 by an electroplating method in order to fill the wiring grooves 8a, 8b, 8c. An unnecessary part of the copper film on the second interlayer insulating film 9 is removed by a CMP method. Metal wirings 13a, 13b, 13c of the copper film are thus formed in the wiring grooves 8a, 8b, 8c, respectively. In the present embodiment, the metal wirings 13a, 13b, 13c are formed by a so-called single damascene method. However, these metal wirings may be formed by forming a metal film on the first interlayer insulating film 5 and etching the metal film. Alternatively, the contact plugs and the metal wirings may be formed simultaneously by a dual damascene method.

In the step of FIG. 6A, the second groove 1b surrounding the active region of the transistor formation region AreaT and the first groove 1a formed in the fuse element formation region AreaH are formed so that the second groove 1b and the first groove 1a are separated from each other. However, the second groove 1b and the first groove 1a need not necessarily be separated from each other. The first groove 1a may be a part of the element isolation surrounding the active region of the transistor formation region AreaT. In this case, three sides of the element isolation surrounding the active region of the transistor formation region AreaT are an element isolation insulating film 2a, and one side of the element isolation is a thick insulating film 2.

In the present embodiment, a polysilicon film was used as the fuse element 4. However, the present invention is not limited to this. For example, the fuse element 4 may have a laminated structure of a polysilicon film and a silicide film formed on the polysilicon film. For example, a cobalt silicide film may be formed on selectively exposed polysilicon by a salicide technique after the n-type source/drain diffusion layer 12A is formed in the step of FIG. 6C. A fuse element 4 having a laminated structure of a polysilicon film and a cobalt silicide film formed on the polysilicon film can thus be formed. In the above process, the cobalt silicide film is formed also on the gate electrode 4A and the n-type source/drain diffusion layer 12A.

What is claimed is:

1. A semiconductor device, comprising:
    a first insulating film formed on a semiconductor substrate;

a second insulating film formed on a region of the semiconductor substrate which is adjacent to the first insulating film, and being thinner than the first insulating film;

a fuse element extending on the first insulating film and the second insulating film, and having a first region which serves as a fuse portion, a second region connected to one side of the first region, and a third region connected to another side of the first region;

a first interlayer insulating film formed on the fuse element;

at least one first contact plug extending through the first interlayer insulating film to the second region of the fuse element;

at least one second contact plug extending through the interlayer insulating film to the third region of the fuse element;

a first wiring formed on the first interlayer insulating film and connected to the at least one first contact plug;

a second wiring formed on the first interlayer insulating film and connected to the at least one second contact plug; and wherein a pattern width of the first region is narrower than a pattern width of the second region and the third region, a pattern width of the second region is substantially equal to a pattern width of the third region, and the entire second region is formed on the first insulating film, and at least a part of the third region is formed on the second insulating film.

2. The semiconductor device according to claim 1, wherein a total plane area of the at least one second contact plug is larger than a total plane area of the at least one first contact plug.

3. The semiconductor device according to claim 1, further comprising:

an element isolation insulating film formed on the semiconductor substrate; and a MIS (Metal Insulator Semiconductor) transistor having a gate insulating film and a gate electrode, the gate insulating film being formed on a region of the semiconductor substrate which is surrounded by the element isolation insulating film, and the gate electrode being formed on the gate insulating film, wherein the first insulating film and the element isolation insulating film have a substantially same thickness, the second insulating film and the gate insulating film have a substantially same thickness, and the fuse element and the gate electrode are formed from a same conductor material.

4. The semiconductor device according to claim 1, wherein the fuse element is formed from a polysilicon film.

5. The semiconductor device according to claim 1, wherein the second region and a part of the first region are formed on the first insulating film, and the third region and the remaining part of the first region are formed on the second insulating film.

6. The semiconductor device according to claim 1, wherein at least a part of the first region of the fuse element is blown by applying a current to the fuse element.

7. The semiconductor device according to claim 1, wherein a sidewall is formed on a side surface of the fuse element.

8. The semiconductor device according to claim 1, further comprising a second interlayer insulating film formed on the first interlayer insulating film and sandwiched between the first and second wirings, wherein the second interlayer film is not formed on the first and second wirings.

9. The semiconductor device according to claim 8 wherein the first wiring is formed in a first wiring groove formed in the second interlayer insulating film, and the second wiring is formed in a second wiring groove formed in the second interlayer insulating film.

* * * * *